United States Patent
Rose et al.

(10) Patent No.: US 7,718,092 B2
(45) Date of Patent: *May 18, 2010

(54) ALUMINUM THICK FILM COMPOSITION(S), ELECTRODE(S), SEMICONDUCTOR DEVICE(S) AND METHODS OF MAKING THEREOF

(75) Inventors: Michael Rose, Bristol (GB); Richard John Sheffield Young, Bath (GB)

(73) Assignees: E.I. du Pont de Nemours and Company, Wilmington, DE (US); DuPont (UK) Limited

(*) Notice: Subject to any disclaimer, the term of this patent is extended or adjusted under 35 U.S.C. 154(b) by 672 days.

This patent is subject to a terminal disclaimer.

(21) Appl. No.: 11/516,071

(22) Filed: Sep. 6, 2006

(65) Prior Publication Data

US 2007/0079868 A1   Apr. 12, 2007

Related U.S. Application Data

(60) Provisional application No. 60/725,348, filed on Oct. 11, 2005.

(51) Int. Cl.
*H01B 1/22* (2006.01)
*H01L 31/00* (2006.01)
*H02N 6/00* (2006.01)

(52) U.S. Cl. .................. 252/512; 252/500; 252/514; 136/252; 136/256

(58) Field of Classification Search ............... 252/500, 252/512, 514; 136/252, 256

See application file for complete search history.

(56) References Cited

U.S. PATENT DOCUMENTS

| | | | |
|---|---|---|---|
| 4,256,513 A | | 3/1981 | Yoshida et al. |
| 4,293,451 A | * | 10/1981 | Ross .................. 252/512 |
| 4,737,197 A | | 4/1988 | Nagahara et al. |
| 5,178,685 A | | 1/1993 | Borenstein et al. |
| 5,198,154 A | * | 3/1993 | Yokoyama et al. ......... 252/514 |
| 5,378,408 A | * | 1/1995 | Carroll et al. ............. 252/514 |
| 5,380,372 A | | 1/1995 | Campe et al. |
| 5,627,081 A | | 5/1997 | Tsuo et al. |
| 5,645,765 A | | 7/1997 | Asada et al. |
| 5,899,704 A | | 5/1999 | Schlosser et al. |
| 6,096,968 A | | 8/2000 | Schlosser et al. |
| 6,117,367 A | | 9/2000 | Bezama et al. |

(Continued)

FOREIGN PATENT DOCUMENTS

EP       1 732 136 A2    12/2006

(Continued)

OTHER PUBLICATIONS

Rose and Young, U.S. Appl. No. 12/371,658, (2009).*

(Continued)

*Primary Examiner*—Basia Ridley
*Assistant Examiner*—Michael Varco

(57) ABSTRACT

The present invention is directed to a thick film conductor composition comprised of (a) aluminum-containing powder; (b) amorphous silicon dioxide (c) and one or more optional glass frit compositions; dispersed in (d) organic medium. The amorphous silicon dioxide contributes to significant bow reduction tendency for solar cells thinner than 270 microns and larger than five inches square without significant effect on reducing the electrical performance of the fired solar cell. In addition and as preferred by solar cell manufacturers, the addition of glass frit reduces the dusting tendency of the aluminum thick film composition.

9 Claims, 2 Drawing Sheets

U.S. PATENT DOCUMENTS

| | | | |
|---|---|---|---|
| 6,294,726 B1 | 9/2001 | Hassler et al. | |
| 6,448,105 B1 | 9/2002 | Sterk | |
| 6,541,695 B1 | 4/2003 | Mowles | |
| 6,703,295 B2 | 3/2004 | Meier et al. | |
| 7,494,607 B2 * | 2/2009 | Wang et al. | 252/514 |
| 2002/0062858 A1 | 5/2002 | Mowles | |
| 2004/0003836 A1 * | 1/2004 | Watsuji et al. | 136/243 |
| 2006/0272700 A1 * | 12/2006 | Young et al. | 136/256 |
| 2006/0273287 A1 * | 12/2006 | Young et al. | 252/500 |

FOREIGN PATENT DOCUMENTS

| | | |
|---|---|---|
| EP | 1 732 137 A2 | 12/2006 |
| JP | 11-330512 A | 11/1999 |
| JP | 2001-015782 A | 1/2001 |
| JP | 2001-127317 A | 5/2001 |
| JP | 2001-313400 A | 11/2001 |
| JP | 2003-223813 A | 8/2003 |
| JP | 2004-146521 A | 5/2004 |
| WO | WO 94/07268 | 3/1994 |
| WO | WO 02/103810 A1 | 12/2002 |

OTHER PUBLICATIONS

Alan F. Carroll, Christian Frederic, Richard J. S. Young, Improved Frontside Silver Paste for CZ SI Cells, 17th European Photovoltaic Solar Energy Conf. (17th PVSEC), Munich, Germany, Oct. 2001.

* cited by examiner

US 7,718,092 B2

ALUMINUM THICK FILM COMPOSITION(S), ELECTRODE(S), SEMICONDUCTOR DEVICE(S) AND METHODS OF MAKING THEREOF

FIELD OF THE INVENTION

The present invention is directed primarily to thick film compositions, electrodes, and semiconductor devices. It is further directed to a silicon semiconductor device. In particular, it pertains to an electroconductive composition used in the formation of a thick film electrode of a solar cell.

BACKGROUND OF THE INVENTION

The present invention can be applied to a broad range of semiconductor devices, although it is especially effective in light-receiving elements such as photodiodes and solar cells. The background of the invention is described below with reference to solar cells, as a specific example of the prior art.

A conventional solar cell structure with a p-type base has a negative electrode that is typically on the front-side or sun side of the cell and a positive electrode on the back-side. It is well known that radiation of an appropriate wavelength falling on a p-n junction of a semiconductor body serves as a source of external energy to generate hole-electron pairs in that body. The potential difference that exists at a p-n junction, causes holes and electrons to move across the junction in opposite directions and thereby give rise to flow of an electric current that is capable of delivering power to an external circuit. Most solar cells are in the form of a silicon wafer that has been metallized, i.e., provided with metal contacts which are electrically conductive.

During the formation of the solar cell, an Al paste is generally screen printed and dried on the back-side of the silicon wafer. The wafer is then fired at a temperature above the melting point of Al to form a Al—Si melt, subsequently, during the cooling phase, a epitaxially grown layer of silicon is formed that is doped with Al. This layer is generally called the back surface field (BSF) layer, and helps to improve the energy conversion efficiency of the solar cell.

Most electric power-generating solar cells currently used are silicon solar cells. Process flow in mass production is generally aimed at achieving maximum simplification and minimizing manufacturing costs. Electrodes in particular are made by using a method such as screen printing from a metal paste.

An example of this method of production is described below in conjunction with FIG. 1. FIG. 1 shows a p-type silicon substrate, 10.

In FIG. 1(b), an n-type diffusion layer, 20, of the reverse conductivity type is formed by the thermal diffusion of phosphorus (P) or the like. Phosphorus oxychloride ($POCl_3$) is commonly used as the gaseous phosphorus diffusion source, other liquid sources are phosphoric acid and the like. In the absence of any particular modification, the diffusion layer, 20, is formed over the entire surface of the silicon substrate, 10. This diffusion layer has a sheet resistivity on the order of several tens of ohms per square ($\Omega/\square$), and a thickness of about 0.2 to 0.5 µm. The p-n junction is formed where the concentration of the p-type dopant equals the concentration of the n-type dopant, conventional cells that have the p-n junction close to the sun side, have a junction depth between 0.05 and 0.5 µm.

After formation of this diffusion layer excess surface glass is removed from the rest of the surfaces by etching by an acid such as hydrofluoric acid.

Next, a silicon nitride film, 30, is formed as an anti-reflection coating on the n-type diffusion layer, 20, to a thickness of between 0.05 and 0.1 µm in the manner shown in FIG. 1(d) by a process, such as plasma chemical vapor deposition (CVD).

As shown in FIG. 1(e), a silver paste, 500, for the front electrode is screen printed then dried over the silicon nitride film, 30. In addition, a back side silver or silver/aluminum paste, 70, and an aluminum paste, 60, are then screen printed (or some other application method) and successively dried on the back side of the substrate. Normally, the back side silver or silver/aluminum is screen printed onto the silicon first as two parallel strips or as rectangles ready for soldering interconnection strings (presoldered copper ribbons), the aluminum is then printed in the bare areas with a slight overlap over the silver or silver/aluminum. In some cases, the silver or silver/aluminum is printed after the aluminum has been printed. Firing is then typically carried out in an infrared furnace at a temperature range of approximately 700 to 990° C. for a period of from several seconds to several tens of minutes. The front and back electrodes can be fired sequentially or co-fired.

Consequently, as shown in FIG. 1(f), molten aluminum from the paste dissolves the silicon during the firing process and then on cooling dopes the silicon that epitaxially grows from the silicon base, 10, forming a p+ layer, 40, containing a high concentration of aluminum dopant. This layer is generally called the back surface field (BSF) layer, and helps to improve the energy conversion efficiency of the solar cell. A thin layer of aluminum is generally present at the surface of this epitaxial layer.

The aluminum paste is transformed by firing from a dried state, 60, to an aluminum back electrode, 61. Prior art back side aluminum pastes typically utilize aluminum particles of predominantly spherical shape derived from the atomization process where the particles are formed wherein the particle sizes and shapes are not discriminated. The back side silver or silver/aluminum paste, 70, is fired at the same time, becoming a silver or silver/aluminum back electrode, 71. During firing, the boundary between the back side aluminum and the back side silver or silver/aluminum assumes an alloy state, and is connected electrically as well. The aluminum electrode accounts for most areas of the back electrode, owing in part to the need to form a p+ layer, 40. Since soldering to an aluminum electrode is impossible, a silver or silver/aluminum back electrode is formed over portions of the back side (often as 2-6 mm wide busbars) as an electrode for interconnecting solar cells by means of pre-soldered copper ribbon or the like. In addition, the front electrode-forming silver paste, 500, sinters and penetrates through the silicon nitride film, 30, during firing, and is thereby able to electrically contact the n-type layer, 20. This type of process is generally called "firing through." This fired through state is apparent in layer 501 of FIG. 1(f).

Additionally, while conventional solar cells provide a working design, there is still a need to provide higher efficiency devices. The present invention provides such a higher efficiency device and a method for forming such a device.

United States Patent Publication 2004/0003836 to Watsuji et al. discloses a paste composition for forming an electrically conductive layer on a p-type silicon semiconductor substrate comprising aluminum powder, an organic vehicle and powder of at least one inorganic compound selected from a group consisting of an oxide-based inorganic compound and a non-oxide-based inorganic compound. Watsuji et al. further discloses that "[i]f the content of the inorganic compound powder is less than 0.3 mass percent, it is not possible to sufficiently inhibit the fired p-type silicon semi-conductor substrate from being deformed by adding the inorganic compound powder." Additionally, the reduction in deformation or bowing as disclosed in Watsuji et al, is inadequate to address the requirements of cell manufacturers using back plane aluminum and module makers seeking to use current wafer thickness of less than 240 microns in a size of greater than 125 mm (5 inches) square where increased and costly breakage rates during production handling are observed when the bowing is greater than 1.5 mm.

Furthermore, there is an on-going effort to provide compositions that are lead free while at the same time maintaining electrical performance and other relevant properties of the device. The present inventors desired to create novel Al comprising composition(s) and semiconductor devices that simultaneously provide such a Pb-free system while still maintaining electrical performance and novel compositions that provide superior electrical performance. The current invention provides such compositions and devices. Furthermore, the composition(s) of the present invention lead to reduced bowing in some embodiments of the invention.

SUMMARY OF THE INVENTION

The present invention relates to a thick film conductor composition for use in forming a p-type electrode. It further relates to the process of forming and use of the composition in semiconductor devices and the semiconductor device itself.

The present invention is directed to a thick film conductor composition comprised of: (a) aluminum-containing powder; (b) amorphous silicon dioxide (c) one or more optional glass frit compositions; dispersed in (d) organic medium. The amorphous silicon dioxide contributes to significant bow reduction tendency for solar cells thinner than 270 microns and larger than five inches square without significant effect on reducing the electrical performance of the fired solar cell. In addition and as preferred by solar cell manufacturers, the addition of optional glass frit to reduce the dusting tendency of the aluminum.

The present invention is further directed to a process of forming a solar cell and the solar cell itself which utilizes a silicon substrate having a p-type and an n-type region, and a p-n junction, which comprises screen-printing the back-side of said substrate, screen printing the compositions as detailed above, and firing the printed surface at a temperature of 700-990 degrees C.

Figure 1A:
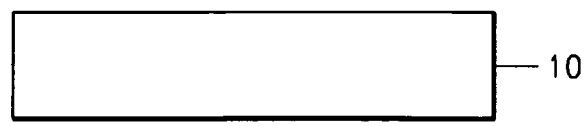
FIGS. 1 (*a*)-(*f*) show a process flow diagram illustrating the fabrication of a semiconductor device.
Figure 1B:
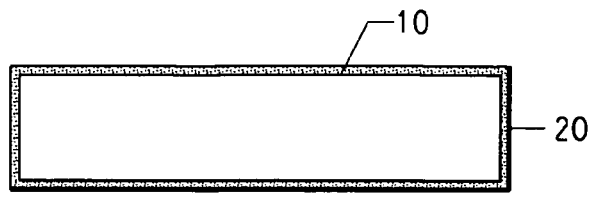
Figure 1C:
Figure 1D:
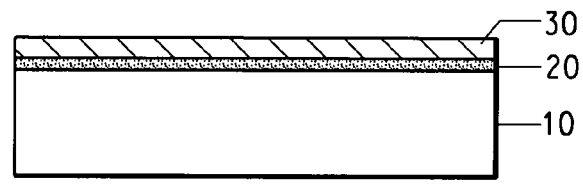
Figure 1E:
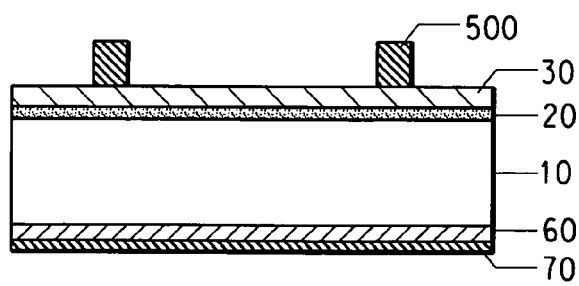
Figure 1F:
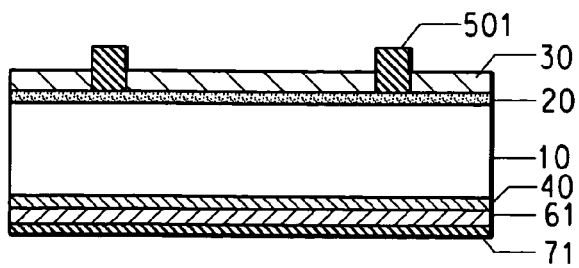

Reference numerals shown in FIGS. 1 (*a*)-(*f*) are explained below.

10: p-type silicon substrate
20: n-type diffusion layer
30: silicon nitride film, titanium oxide film, or silicon oxide film
40: p+ layer (back surface field, BSF)
60: aluminum paste formed on back side
61: aluminum back electrode (obtained by firing back side aluminum paste)
70: silver/aluminum paste formed on back side
71: silver/aluminum back electrode (obtained by firing back side silver/aluminum paste)
500: silver paste formed on front side
501: silver front electrode (formed by firing front side silver paste)

FIGS. 2(*a*)-(*d*) explain the manufacturing processes for manufacturing a solar cell using the electroconductive paste of the present invention. Reference numerals shown in FIGS. 2(*a*)-(*d*) are explained below.
102 Silicon substrate
104 Light-receiving surface side electrode
106 Paste composition for a first electrode
108 Electroconductive paste for a second electrode
110 First electrode
112 Second electrode

DETAILED DESCRIPTION OF THE INVENTION

The main components of the thick film composition(s) of the present invention are an aluminum-containing powder, amorphous silicon dioxide, an optional glass frit, and organic medium. In one embodiment, the glass frit in the composition is a Pb-free glass composition. The compositions as stated also provide lower bowing than prior art systems and maintaining or improving the electrical performance.

Aluminum-Containing Powder

The metallic powder of the present invention is an aluminum-containing powder. In one embodiment, the aluminum-containing powder comprises atomized aluminum. The atomized aluminum may be atomized in either air or inert atmosphere. The average particle size distribution of the atomized aluminum powder is in the range of 3 to 50 microns. In one embodiment, the average particle size distribution of the aluminum-containing powder is in the range of 3 to 20 microns. In one embodiment, the Al-containing powder is present in the range of 74 to 75 weight percent total composition. In one embodiment, the Al-containing powder is present in the range of 50-82 weight percent total composition.

The aluminum-containing powder of the present invention may be further accompanied by other metallic powders such as silver-containing powders.

Inorganic Additives

The present invention must comprise the inclusion of silicon dioxide in a finely divided and amorphous state. The inclusion of the amorphous silicon dioxide leads to a significant reduction of cell deformation or bowing at levels including and below 0.3 weight percent addition for various wafer thicknesses. In one embodiment, the amorphous silicon dioxide is present in the composition in the range of 1 weight percent or less. In a further embodiment, the amorphous silicon dioxide is present in the range of 0.3 weight percent to 1 weight percent. In a further embodiment, the amorphous silicon dioxide is present in the amount of less than 0.3 weight percent. In a further embodiment, the amorphous silicon dioxide is present in the range of 0.1 to 0.3 weight percent and still a further embodiment, the amorphous silicon dioxide is present in the range of 0.05 to 0.3 weight percent. In one embodiment, the Al-containing powder is present in the range of 74 to 75 weight percent total composition.

As demonstrated in one embodiment of the present invention, additions of amorphous silicon dioxide to aluminum pastes applied to wafers of thickness in the range 170-330 microns lead to industry acceptable bowing of less than 1.5 mm on wafers up to and including standard wafers in the range of 5-6 inches square. The addition of crystalline silicon dioxide powder does not impact the bowing tendency in the same way at all. We believe that the presence of the amorphous silicon dioxide in low quantities as a component to reduce the temperature coefficient of expansion of the sintered body is not the mechanism of bow reduction. The addition of amorphous silicon dioxide renders the layer very friable but does not inhibit the formation of the back surface field so important for the electrical function of the solar cell. We believe that the finely divided and amorphous state is important in creating a distributed surface layer on the aluminum particles that considerably reduces the inter-particle cohesion. Therefore, the compositions of the present invention comprising amorphous silicon dioxide in less than 0.3 weight percent provide a solar cell with reduced bowing and maintained or improved electrical efficiency. At additions of 0.3 weight percent and greater, we see the reduction in the electrical performance of the cell when compared with an aluminum system without the addition and is so not of advantage to the cell manufacturer.

Inorganic Binder(s)-Glass Frit(s)

The Aluminum-containing powders described herein above are finely dispersed in an organic medium and are additionally accompanied by one or more inorganic binders. Specifically, the inorganic binder(s) useful in the present invention are glass frit(s).

The present invention optionally includes a glass frit composition. The inclusion of a glass composition is designed to reduce dusting of the surface and co-incidentally maintain low deformation or bowing in the fired wafer. The present invention may comprise one or more glass frit compositions. In one embodiment, at least one glass frit composition upon firing said glass frit composition undergoes recrystallization or phase separation and liberates a frit with a separated phase that has a lower softening point than the original softening point. Thus, the thick film composition comprising such a glass frit upon processing gives lower bowing properties. Typically, the original softening point of the glass frit composition is in the range of 325 to 600° C.

In one embodiment, the glass frit of the present invention is a Pb-free glass frit which upon firing undergoes recrystallization or phase separation and liberates a frit with a separated phase that has a lower softening point than the original softening point. Mixtures of frits are possible.

The function of an inorganic binder in an aluminum composition is primarily to provide a means to increase the efficiency with which the silicon is accessed by the molten aluminum during the firing process, in addition to this function, the binder will provide some additional cohesion and adhesion properties to the substrate. The need for the inorganic binder in this instance is more important for silicon substrates that have layers of silica or siliceous glasses as remnants from wafer processing. A further function of the inorganic binder is the affecting of the influence of the aluminum layer on the extent of bowing of the finished cell. The binder can also increase the alloying depth of the aluminum into the silicon so enhancing or increasing the Al dopant concentration in the eutectically grown silicon layer.

The chemistry of the glass frit(s) of the present invention are important. The glass frit(s) are chosen based on the effectiveness that it they have on improving the electrical performance of the aluminum thick film paste without compromising other considerations such as environmental legislation or public desire to exclude heavy metals of potential environmental concern.

The content of the glass frit as an inorganic binder is important in that it affects the electrical performance of the resultant cell. The content is determined by the glass or inorganic content and is between 0.01 percent and 5 percent weight percent based on total thick film composition, with an preferred level for electrical performance and bowing in the range 0.01% and 2% dependent on the chemistry of the glass frit.

Some of the glass binders useful in the composition are conventional in the art. Some examples include borosilicate and aluminosilicate glasses. Examples further include combinations of oxides, such as: $B_2O_3$, $SiO_2$, $Al_2O_3$, CdO, CaO, BaO, ZnO, $SiO_2$, $Na_2O$, $Li_2O$, PbO, and ZrO which may be used independently or in combination to form glass binders. Typical metal oxides useful in thick film compositions are conventional in the art and can be, for example, ZnO, MgO, CoO, NiO, FeO, MnO and mixtures thereof. Glass binders that influence the bowing properties are specific in composition.

The conventional glass frits most preferably used are the borosilicate frits, such as lead borosilicate frit, bismuth, cadmium, barium, calcium, or other alkaline earth borosilicate frits. The preparation of such glass frits is well known and consists, for example, in melting together the constituents of the glass in the form of the oxides of the constituents and pouring such molten composition into water to form the frit. The batch ingredients may, of course, be any compounds that will yield the desired oxides under the usual conditions of frit production. For example, boric oxide will be obtained from boric acid, silicon dioxide will be produced from flint, barium oxide will be produced from barium carbonate, etc.

The glass is preferably milled in a ball mill with water or inert low viscosity, low boiling point organic liquid to reduce the particle size of the frit and to obtain a frit of substantially uniform size. It is then settled in water or said organic liquid to separate fines and the supernatant fluid containing the fines is removed. Other methods of classification may be used as well.

The glasses are prepared by conventional glassmaking techniques, by mixing the desired components in the desired proportions and heating the mixture to form a melt. As is well known in the art, heating is conducted to a peak temperature and for a time such that the melt becomes entirely liquid and homogeneous. The desired glass transition temperature is in the range of 325 to 600° C.

It is preferred that at least 85% the inorganic binder particles be 0.1-10 μm. The reason for this is that smaller particles having a high surface area tend to adsorb the organic materials and thus impede clean decomposition. On the other hand, larger size particles tend to have poorer sintering characteristics. It is preferred that the weight ratio of inorganic binder to total paste contents be in the range 0.1 to −2.0 and more preferably in the range 0.2 to 1.25.

The addition of glass frit reduces or eliminates the dusting and transfer of free aluminum or alumina dust to other metallic surfaces so reducing the solderability and adhesion of ribbons tabbed to said surface particularly relevant when manufacturers wish to stack fired solar cells.

In one embodiment, the highly dispersed amorphous silicon dioxide is present at levels of below 0.3 weight percent and glass frit at levels below 0.65 weight percent total thick film composition. In this embodiment, the thick film composition was utilized to produce solar cells with lower bowing tendency than without the additions (i.e., of amorphous silicon dioxide and glass frit) for solar cells thinner than 270 microns thick and 5 inches square and larger in size.

Organic Medium

The inorganic components are typically mixed with an organic medium by mechanical mixing to form viscous compositions called "pastes", having suitable consistency and rheology for printing. A wide variety of inert viscous materials can be used as organic medium. The organic medium must be one in which the inorganic components are dispersible with an adequate degree of stability. The rheological properties of the medium must be such that they lend good application properties to the composition, including: stable dispersion of solids, appropriate viscosity and thixotropy for screen printing, appropriate wettability of the substrate and the paste solids, a good drying rate, and good firing properties. The organic vehicle used in the thick film composition of the present invention is preferably a nonaqueous inert liquid. Use can be made of any of various organic vehicles, which may or may not contain thickeners, stabilizers and/or other common additives. The organic medium is typically a solution of polymer(s) in solvent(s). Additionally, a small amount of additives, such as surfactants, may be a part of the organic medium. The most frequently used polymer for this purpose is ethyl cellulose. Other examples of polymers include ethylhydroxyethyl cellulose, wood rosin, mixtures of ethyl cellulose and phenolic resins, polymethacrylates of lower alcohols, and monobutyl ether of ethylene glycol monoacetate can also be used. The most widely used solvents found in thick film compositions are ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility requirements desired.

The polymer present in the organic medium is in the range of 0 weight percent to 11 weight percent of the total composition. The thick film composition of the present invention may be adjusted to a predetermined, screen-printable viscosity with the organic polymer containing medium.

The ratio of organic medium in the thick film composition to the inorganic components in the dispersion is dependent on the method of applying the paste and the kind of organic medium used, and it can vary. Usually, the dispersion will contain 40-95 wt % of inorganic components and 5-60 wt % of organic medium (vehicle) in order to obtain good wetting.

The electroconductive paste of the present invention is typically conveniently manufactured by power mixing, a dispersion technique that is equivalent to the traditional roll milling, roll milling or other mixing technique can also be used. The electroconductive paste of the present invention is preferably spread on the desired part of the back face of a solar cell by screen printing; in spreading by such a method, it is preferable to have a viscosity in a prescribed range. Other application methods can be used such as silicone pad printing. The viscosity of the electroconductive paste of the present invention is preferably 20-200 PaS when it is measured at a spindle speed of 10 rpm and 25° C. by a utility cup using a Brookfield HBT viscometer and #14 spindle.

The Ag/Al or Ag film can be cofired with Al paste of the present invention at the same time in a process called cofiring. Next, an example in which a solar cell is prepared using the electroconductive paste (aluminum electroconductive paste) of the present invention is explained, referring to the figure (FIG. 2).

First, a Si substrate 102 is prepared. On the light-receiving side face (surface) of the Si substrate, normally with the p-n junction close to the surface, electrodes (for example, electrodes mainly composed of Ag) 104 are installed (FIG. 2(a)). On the back face of the substrate, a Ag or Ag/Al electroconductive paste (although it is not particularly limited as long as it is used for a solar cell, for example, PV202 or PV502 or PV583 or PV581 (commercially available from E.I. Du Pont de Nemours and Company)) is spread to form either bus bars or tabs to enable interconnection with other cells set in parallel electrical configuration. On the back face of the substrate, the novel aluminum pastes of the present invention used as a back face (or p-type contact) electrode for a solar cell, 106 are spread by screen printing using the pattern that enable slight overlap with the conductive Ag or Ag/Al paste referred to above, etc, then dried (FIG. 2(b)). The drying temperature of each paste is preferably 150° C. or lower in a static drier for 20 minutes or 7 minutes in a belt drier with a temperature above 200° C. for 3 minutes (DEK drier model 1209 settings: lamp settings 9 and speed 3. Also, the aluminum paste preferably has a dried film thickness of 15-60 μm, and the thickness of the silver/aluminum electroconductive paste of the present invention is preferably 15-30 μm. Also, the overlapped part of the aluminum paste and the silver/aluminum electroconductive paste is preferably about 0.5-2.5 mm.

Figure 2A:
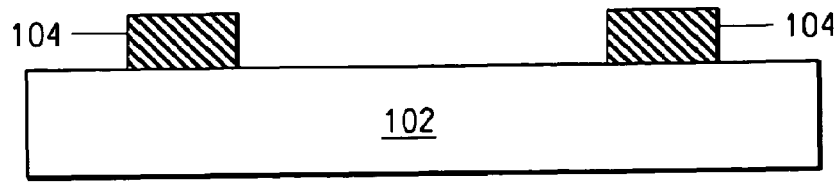
Figure 2B:
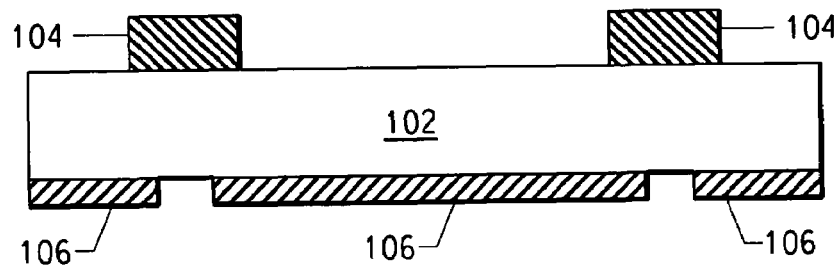
Figure 2C:
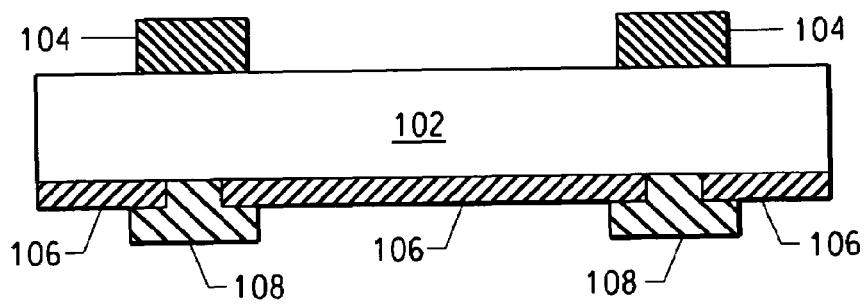
Figure 2D:
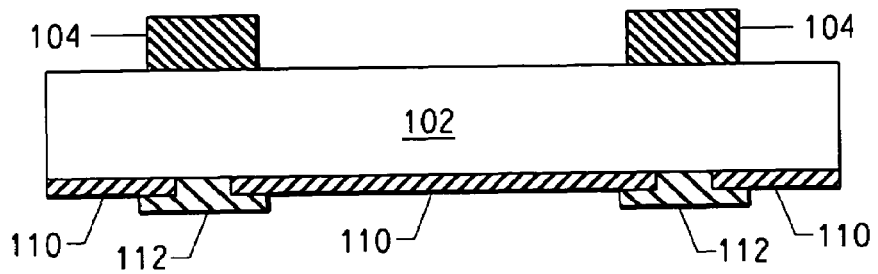

Next, the substrate obtained is fired at a temperature of 700-990° C. for about 3 seconds-15 min, for instance, so that the desired solar cell is obtained (FIG. 2(d)). An electrode is formed from the composition(s) of the present invention wherein said composition has been fired to remove the organic medium and sinter the glass frit.

The solar cell obtained using the electroconductive paste of the present invention, as shown in FIG. 2(d), has electrodes 104 on the light-receiving face (surface) of the substrate (for example, Si substrate) 102, Al electrodes 110 mainly composed of Al and silver/aluminum electrodes 112 mainly composed of Ag and Al, on the back face.

The present invention will be discussed in further detail by giving practical examples. The scope of the present invention, however, is not limited in any way by these practical examples.

EXAMPLES

The examples cited here are based on firing said example pastes on wafers that have silicon nitride anti-reflection coating and are conventional cell designs with a front side n-type contact thick film silver paste. The performance of the paste is defined in terms of the electrical properties and additionally the bowing of the cell after firing (defined as the deflection of the fired cell at room temperature and the distance traveled at the centre of the wafer to achieve a flat cell).

(1) Aluminum Paste With Finely Divided Amorphous Silicon Dioxide

Mixtures of aluminum powders with silicon dioxide are described here. It is known from U.S. Patent Publication 2004/0003836 that the relative silicon dioxide content with respect to the aluminum powder content and particle size affects electrical properties and extent of bowing of thinner cells to the lower level of 0.3 weight %. In the examples B and C cited in Table 1, we confirm that if crystalline silicon dioxide is added below the lower level that the bowing is not effected significantly in reference to A without the addition.

In the examples E to H cited in Table 1, it is shown that when the silicon dioxide is in the amorphous form at levels above 0.3% the electrical function deteriorates as with the crystalline form but when the addition is less than 0.3%, then the electrical performance of the solar cell is not affected significantly and the bowing tendency is reduced dramatically compared to the system without the amorphous silicon dioxide addition.

In the examples cited in Table 1 paste compositions wherein the silicon dioxide is added and the bowing and electrical properties are measured as a function of silicon dioxide content and crystalline state compared to a standard system without additives.

In the examples cited in Table 1, the silicon dioxide was mixed with L20624 from Silberline Ltd, which contains an aluminum powder.

The pastes were printed on 270 micron thick wafers of 5 inches square multicrystalline silicon pre-processed to the point where the next step is printing and firing. The wafers were converted to cells by firing in a Centrotherm 4 zone furnace with zone temperatures defined as zone 1=450° C., zone 2=520° C., zone 3=575° C. and the final zone set at 950° C. with a belt speed of 2150 mm/min. The electrical performance and the measurement of the bow was undertaken, the measurement of the efficiency and Fill Factor (FF) is shown in Table 1.

Table 1 shows that the reduction in bowing for the system using pastes B and C compared to the control paste A, shows that the bowing is reduced, however, when the silicon dioxide type is changed from crystalline to amorphous, as is shown by the compositions E to H, compared to the control D, the extent of bowing is reduced significantly.

(2) Aluminum Paste with Glass Frit and Silicon Dioxide

Mixtures of aluminum powders with glass frits and silicon dioxide are described here. The relative glass content with respect to the aluminum powder content and particle size is known from prior art to affect the electrical properties and the extent of bowing of thinner cells.

In the examples I to P in

Table 2 we cite mixtures of glass Q (as described in

Table 3) and amorphous silicon dioxide showing the impact on the electrical performance and bowing tendency for the large 6 inch and thin 180 micron wafers. Note that the bowing tendency in larger and thinner wafers is greater than with smaller wafers.

We can see that compared to the base system, I, which does not contain either the silicon dioxide or the glass, that the bowing is reduced on introduction of amorphous silicon dioxide in the presence of glass frit, furthermore, by varying the relative proportions of glass and amorphous silicon dioxide, that the bowing tendency and electrical performance can be manipulated to provide better overall performance. The composition of the glass frit cited here is given in Table 3.

TABLE 1

Performance at peak temperature of 950 Degrees Centigrade

|   | N-type conductor | % Organic | % Al | % SiO2 Amorphous | % SiO2 Crystalline | % Frit | Eff (%) | FF | Bowing (wafer thickness/size) 270 um 5 inch |
|---|---|---|---|---|---|---|---|---|---|
| A | PV147 | 25.0 | 75.0 | 0.0 | 0.0 | 0.0 | 13.64 | 73.84 | 627 |
| B | PV147 | 24.9 | 74.8 |  | 0.3 | 0.00 | 13.52 | 74.47 | 577 |
| C | PV147 | 24.7 | 74.3 |  | 1.0 | 0.00 | 13.17 | 73.06 | 555 |
| D | PV147 | 25.0 | 75.0 | 0.0 | 0.0 | 0.00 | 14.46 | 74.9 | 889 |
| E | PV147 | 25.0 | 74.9 | 0.1 |  | 0.00 | 14.10 | 74.65 | 395 |
| F | PV147 | 24.9 | 74.9 | 0.2 |  | 0.00 | 14.32 | 75.19 | 350 |
| G | PV147 | 24.9 | 74.8 | 0.3 |  | 0.00 | 14.11 | 73.18 | 328 |
| H | PV147 | 24.7 | 74.3 | 1.0 |  | 0.00 | 13.15 | 71.55 | 277 |

TABLE 2

Performance at peak temperature of 950 Degrees Centigrade

|   | N-type conductor | % Organic | % Al | % SiO2 Amorphous | % Frit | Eff (%) | FF | Bowing (wafer thickness/size) 180 um 6 inch |
|---|---|---|---|---|---|---|---|---|
| I | PV147 | 25.00 | 75 | 0.00 | 0.00 | 14.02 | 76.34 | 4151 |
| J | PV147 | 24.87 | 74.63 | 0.00 | 0.50 | 15.04 | 78.30 | 1441 |
| K | PV147 | 25.22 | 74.18 | 0.10 | 0.50 | 15.09 | 78.80 | 1167 |
| L | PV147 | 25.69 | 73.81 | 0.15 | 0.35 | 14.95 | 77.80 | 873 |
| M | PV147 | 25.97 | 73.23 | 0.15 | 0.65 | 15.09 | 78.00 | 691 |
| N | PV147 | 26.58 | 72.72 | 0.20 | 0.50 | 15.15 | 78.60 | 869 |
| O | PV147 | 27.12 | 72.28 | 0.25 | 0.35 | 14.76 | 77.70 | 759 |
| P | PV147 | 27.46 | 71.64 | 0.25 | 0.65 | 15.00 | 78.50 | 620 |

We also see that in an additional of the glass frit, that the tendency towards surface dusting is either reduced significantly or eliminated completely depending on the level of frit introduced.

TABLE 3

Glass composition Q cited

| Weight % as oxides | Q |
|---|---|
| SiO2 | 32.72 |
| ZrO2 | 2.90 |
| B2O3 | 2.90 |
| ZnO | 2.91 |
| MgO | 1.17 |
| TiO2 | 5.23 |
| Na2O | 3.10 |
| Li2O | 0.87 |
| Bi2O3 | 48.20 |

The glass Q and amorphous silicon dioxide is mixed in the proportions as described in Table 2 as in the manner of the art of Table 2 making aluminum pastes, into the product L20624 from Silberline (UK) Ltd which contains an aluminum powder.

The pastes were printed on 180 micron thick wafers of 6 inches square multicrystalline silicon pre-processed to the point where the next step is printing and firing. The wafers are converted to cells by firing in a Centrotherm 4 zone furnace with zone temperatures defined as zone 1=450° C., zone 2=520° C., zone 3=575° C. and the final zone set at 950° C. with a belt speed of 2150 mm/min. The electrical performance and the measurement of the bow is undertaken, the measurement of the efficiency and Fill Factor (FF) is shown in Table 2.

Manufacture of Solar Cell

The present invention can be applied to a broad range of semiconductor devices, although it is especially effective in light-receiving elements such as photodiodes and solar cells. The discussion below describes how a solar cell was formed utilizing the composition(s) of present invention.

Using the aluminum electroconductive paste obtained, a solar cell was formed in the following sequence.

(1) On the back face of a Si substrate having a silver electrode on the front surface (for example, PV147 Ag composition commercially available from E.I. Du Pont de Nemours and Company) was printed and dried. Typical dried thickness is in the range of 15 to 25 microns. Then the Ag or Ag/Al paste (for example, PV202 is a Ag/Al composition commercially available from E.I. Du Pont de Nemours and Company) was printed and dried as 5-6 mm wide bus bars. Then, an aluminum paste for the back face electrode of a solar cell (represents the novel compositions of the present invention) was screen-printed at a dried film thickness of 30-60 μm providing overlap of the aluminum film with the Ag/Al busbar for 1 mm at both edges to ensure electrical continuity. The aluminum paste was dried before firing.

(2) The printed wafers were then fired in these examples in a furnace with peak temperature settings of 850 degrees C. to 965 degrees C. for 3 seconds to 10 minutes, depending on the furnace dimensions and temperature settings. A solar cell was formed after firing.

Test Procedure-Efficiency

The solar cells built according to the method described above were placed in a commercial IV tester for measuring efficiencies (IEET Ltd). The lamp in the IV tester simulated the sunlight with a known intensity and radiated the front surface of the cell, the bus bars printed in the front of the cell were connected to the multiple probes of the IV tester and the electrical signals were transmitted through the probes to the computer for calculating efficiencies.

Solar cell wafers were prepared by using a standard front side contact paste PV147 Ag conductor (commercially available from E.I. Du Pont de Nemours and Company).

Samples were printed onto Wafers Supplied by a PV cell manufacturer that were processed to the point where the thick film pastes were applied and fired. Processed wafers were then measured for electrical performance.

What is claimed is:

1. A thick film conductor composition comprised of:
   (a) aluminum-containing powder,
   (b) amorphous silicon dioxide, and
   (c) organic medium,
wherein said aluminum-containing powder and said amorphous silicon dioxide are dispersed in said organic medium and wherein said silicon dioxide is present in the range of 0.05 to 0.3 weight percent, based on the total weight of the composition.

2. The composition of claim 1 further comprising one or more glass frits.

3. The composition of claim 2 wherein said glass frit is present in the total thick film composition at levels in the range of 0.1 to 0.65 weight percent.

4. The composition of any one of claim 1 or 2 further comprising an Ag-containing powder.

5. The composition of claim 2 wherein said glass frit composition is a lead-free glass frit composition.

6. The thick film composition of any one of claim 1 or 2 wherein said organic medium comprises a polymeric binder and a volatile organic solvent.

7. A process of forming a solar cell utilizing a silicon substrate having a type and an n-type region, and a p-n junction, which comprises screen-printing the back-side of said substrate, screen printing the composition of claim 1, and firing the printed surface at a temperature of 500-990 degrees C.

8. An electrode utilizing the composition of any one of claim 1 or 2.

9. A semiconductor device comprising the electrode of claim 8.

* * * * *